United States Patent [19]

Wang et al.

[11] Patent Number: 5,780,362
[45] Date of Patent: Jul. 14, 1998

[54] COSI$_2$ SALICIDE METHOD

[76] Inventors: Qingfeng Wang, 1310 Electronics Dr., MS 2238, Carrolloton, Tex. 75006; Karen Irma Josef Maex, A. Rulenslaan 31, B-3020, Herent, Belgium

[21] Appl. No.: 658,182

[22] Filed: Jun. 4, 1996

[51] Int. Cl.$^6$ .................................. H01L 21/44
[52] U.S. Cl. ............................. 438/683; 438/686
[58] Field of Search ..................... 437/200, 201; 438/683, 686

[56] References Cited

U.S. PATENT DOCUMENTS

| | | | |
|---|---|---|---|
| 4,378,628 | 4/1983 | Levinstein et al. | |
| 4,912,061 | 3/1990 | Nasr. | |
| 5,047,367 | 9/1991 | Wei et al. | 437/200 |
| 5,162,259 | 11/1992 | Kolar et al. | 437/200 |
| 5,387,535 | 2/1995 | Wilmsmeyer | 437/200 |
| 5,529,958 | 6/1996 | Yaoita | 437/200 |
| 5,543,359 | 8/1996 | Murakami et al. | 437/152 |
| 5,604,153 | 2/1997 | Tsubouchi et al. | 437/173 |

FOREIGN PATENT DOCUMENTS

| | | |
|---|---|---|
| 7-086559 | 3/1995 | Japan. |
| 786559 | 3/1995 | Japan. |

OTHER PUBLICATIONS

Wang, Q.F. et al., "New CoSi$_2$ Salicide Technology for 0.1 µm Processes and Below", 1995 Symposium on VLSI Technology Digest of Technical Papers, pp. 17–18.

Tung, R.T. et al., "Increased uniformity and thermal stability of CoSi$_2$ thin films by Ti capping" Appl. Phys. Lett. 67:2164–2166, Oct. 9, 1995.

Wang et al., "Formation of deep sib-micrometer cobalt silicided poly gate using bilayer process", Proceedings of the Fifth International Symposium on ULSI Science and Technology, Ed. Middlesworth et al., Reno, NV, Electrochemical Society, May 26, 1995.

Formation of Deep Sub-Micrometer Cobalt Silicided Poly Gate Using Bilayer Processes, Q.F. Wang, A. Lauwers, B. Deweerdt, R. Verbeeck, and K. Maex, of Belgium.

*Primary Examiner*—John Niebling
*Assistant Examiner*—Kevin F. Turner
*Attorney, Agent, or Firm*—Knobbe, Martens, Olson & Bear, LLP

[57] ABSTRACT

The present invention relates to a method for forming cobalt disilicide structure on a silicon substrate comprising the steps of depositing a cobalt layer on the substrate, thereafter depositing a refractory metal on the cobalt layer, thereby forming a bilayer structure on the said substrate, and heating the bilayer structure. The present invention also relates to a method for forming self-aligned cobalt disilicide on a metal oxide semiconductor transistor with a source drain and gate regions in a silicon substrate comprising the steps of: depositing a cobalt layer on the substrate, thereafter depositing a refractory metal layer on the cobalt layer, heating the silicon substrate, thereby forming a cobalt dislicide layer on the gate, source, and drain regions of the MOS transistor, and selectively etching the remaining nonsilicide cobalt and refractory metal from the substrate except from the source, drain, and gate regions.

11 Claims, 19 Drawing Sheets

CoSi₂ SALICIDE METHOD

BACKGROUND OF THE INVENTION

1. Field of the Invention

The present invention relates to the field of semiconductor device processing. Specifically, the present invention relates to a method for the fabrication of $CoSi_2$ salicides.

2. Description of the Related Technology

Silicides are known in the art. Metal silicide thin films are commonly used in microelectronic circuits for a variety of applications such as interconnects, contacts and for the formation of transistor gates. Cobalt disilicide ($CoSi_2$) and Titanium disilicide ($TiS_2$) are preferentially used in Ultra or Large Scale Integrated Semiconductor devices with submicron design rules. $CoSi_2$ and $TiSi_2$ silicide phases are formed through the reaction of Cobalt and Titanium with silicon to form Cobalt disilicide ($CoSi_2$) and Titanium disilicide ($TiSi_2$) respectively. The silicide layer has a lower sheet resistance than the sheet resistance of silicon.

U.S. Pat. No. 5,047,367, incorporated herein by reference, discloses the formation of $CoSi_2$ and $TiSi_2$ salicides (self-aligned silicides) on silicon for the manufacture of semiconductor devices. An illustrative embodiment of such salicide technology can be described as follows. To make contact to device regions underlying a dielectric on the surface of the silicon substrate, first an opening or via (contact via) in the dielectric over the region to be contacted is made, and next the contact via is filled with a conductive material. In smaller geometry devices, those of one micron or less, aluminum has proven to be inadequate as fill due to problems such as poor step coverage and poor contact integrity. For these devices suicides of refractory or near-noble metals, such as titanium or cobalt, are used as the initial fill material filling the lower portion of the via in contact with the substrate. The metal is first deposited followed by an anneal to form the silicide on the substrate in the regions exposed by the via. The nonsilicidized metal remaining on the dielectric surface is then selectively etched. Because the silicide is formed only on those regions where there is silicon exposed, that is, the active device regions, and the remaining metal can be selectively etched without a masking step, the structure formed by this process is self aligned. This process is an example of self aligned silicide technology (Salicide Technology).

The more conventional $TiSi_2$ process cannot be easily scaled down to applications with about 0.25 μm or about 0.1 μm or smaller transistor gate lengths because the high resistivity C49 (a specific crystallographical configuration $TiSi_2$) phase predominates on narrow lines. In contrast, $CoSi_2$ can be formed on narrow lines without this problem. Nevertheless, the reproducible and reliable formation of thin $CoSi_2$ on narrow poly-Si transistor gates is still a critical issue.

U.S. Pat. No. 5,047,367 describes a process for the formation of a titanium nitride/cobalt silicide bilayer for use in semiconductor processing. In this document, it is disclosed that a thin layer of titanium is conformally deposited on a silicon substrate using a sputter deposition technique. A conformal layer of cobalt is next deposited by sputter deposition without removing the substrate from the sputter system. The substrate is then annealed. It is believed that during the process, the titanium first cleans the silicon surface of the substrate of any native oxide. During the anneal, the titanium diffuses upward and the cobalt diffuses downward. The cobalt forms a high quality expitaxial cobalt silicide layer on the silicon substrate.

SUMMARY OF THE INVENTION

A $CoSi_2$ salicidation technology with a thin refractory capping layer preferably made of titanium was developed to improve the uniformity of as formed $CoSi_2$ and as such to improve the thermal stability of very narrow $CoSi_2$/Polysilicon stacks. The silicided polysilicon lines are very uniform, and can withstand thermal treatments without significant degradation for transistor gate lengths down to 0.08 μm or below. The present invention provides a method which can be implemented in a CMOS process of about 0.25 μm CMOS gate process. The present invention can also be implemented in gate processes of about 0.18 μm or smaller, about 0.12 μm or smaller, about 0.08 μm or smaller, or about 0.07 μm or smaller. A first aspect of the present invention is a method of forming a cobalt disilicide structure on a silicon substrate comprising the steps of depositing a cobalt layer on the substrate, thereafter depositing a refractory metal on said cobalt layers thereby forming a bilayer structure on said substrate, and heating said bilayer structure.

In a preferred embodiment, the heating step comprises a first and a second heating step. Preferentially, the first heating step is performed between about 450° C. and about 600° C. for a period of time between about 10 and about 100 seconds, and the second heating step is performed between about 600° C. and about 1000° C. for a period of time between about 10 and about 100 seconds. In a highly preferred embodiment, the first heating step is performed at about 550° C. for about 60 seconds and the second heating step is performed at about 700° C. for about 30 seconds.

Preferentially, the deposition steps of the method are performed by sputter deposition in a vacuum system without breaking the vacuum conditions in between possible subsequent deposition steps.

Preferentially, the refractory metal used in the process is titanium. In a preferred version of this embodiment, the cobalt layer is between about 5 and about 50 nm thick and the titanium layer ranges in thickness between about 1 and about 20 nm. In a highly preferred embodiment, the cobalt layer is about 15 nm thick and the titanium layer is about 10 nm thick.

A second aspect of the present invention is a method for forming on a silicon substrate self-aligned Cobalt disilicide on a metal oxide semiconductor transistor with a source, a drain, and a gate region, comprising:

depositing a cobalt layer on said substrate;

thereafter depositing a refractory metal layer on said cobalt layer;

heating said silicon substrate thereby forming a cobalt disilicide layer on the gate, source, and drain regions of said MOS transistor; and selectively etching the remaining nonsilicide cobalt and said refractory metal from said substrate except from said source, drain, and gate regions.

Preferentially, the deposition steps of the method are performed by sputter deposition in a vacuum system without breaking the vacuum conditions in between possible subsequent deposition steps.

In a preferred embodiment, the refractory metal is titanium.

Preferably, the method further comprises the steps of:

defining an active area within said silicon substrate;

growing an oxide on said substrate;

depositing a polysilicon layer on said oxide; and defining said gate, said source, and said drain regions within said active area.

In a preferred embodiment of this method, the cobalt layer has a thickness between about 5 and about 50 nm and the titanium layer has a thickness between about 1 and about 20 nm. In a highly preferred embodiment, the cobalt layer is about 15 nm thick and the titanium layer is about 10 nm thick.

Preferentially, the heating step of the method comprises a first and a second heating step and the selective etching step is performed between the first and second heating steps. In a more highly preferred embodiment of the method, the first heating step is performed in the range of about 450° C. to about 600° C. for a period of time between about 10 and about 100 seconds and the second heating step is performed in the range of about 600° C. to about 1000° C. for a period of time between about 10 and about 100 seconds. In a highly preferred embodiment of the method, the first heating step is performed at about 550° C. for about 60 seconds and the second heating step is performed at about 700° C. for about 30 seconds.

In a preferred embodiment the selective etching step is performed using a $H_2SO_4$ solution and a $NH_4OH$ solution as etchants.

In one embodiment of the invention the gate has a length of about 0.25 μm or smaller. The present invention may also be used with gates of about 0.18 μm or smaller, about 0.12 μm or smaller, about 0.08 μm or smaller, or about 0.07 μm or smaller.

BRIEF DESCRIPTION OF THE DRAWINGS

FIG. 1 shows a flow sheet of a first preferred embodiment of the present invention compared with the state of the art processes, wherein:

- branch I represents a conventional process using only cobalt sputtering, referred to as to be the conventional Co process,
- branch II describes a sputtering conventional Ti/Co process,
- branch III represents the capping Co/Ti process according to the present invention.

Figure 1:
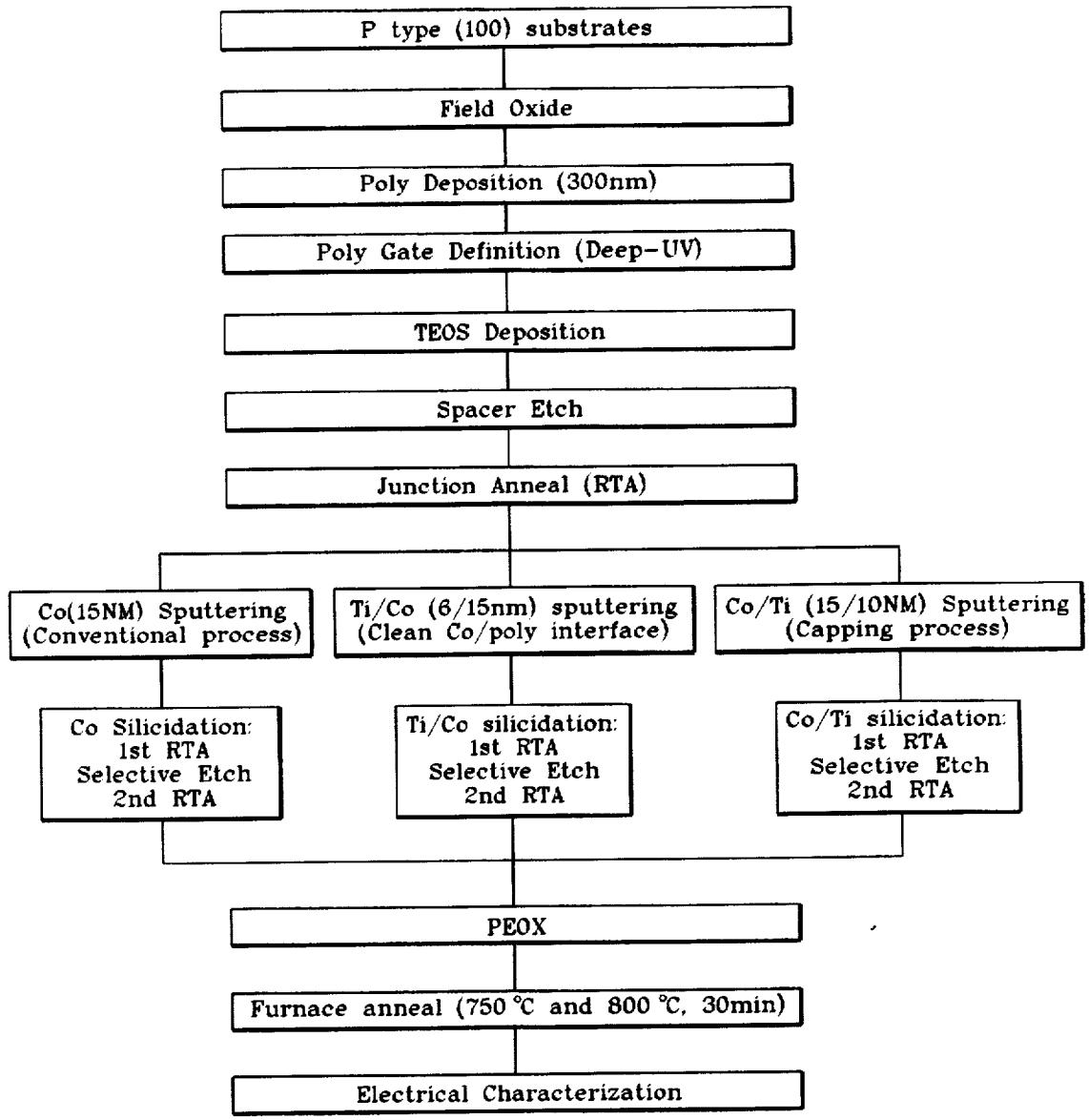

FIGS. 2a–2d represent the schematic views of the devices obtained according to the several steps performed according to the capping Co/Ti process as described in branch III of FIG. 1.

Figure 3:
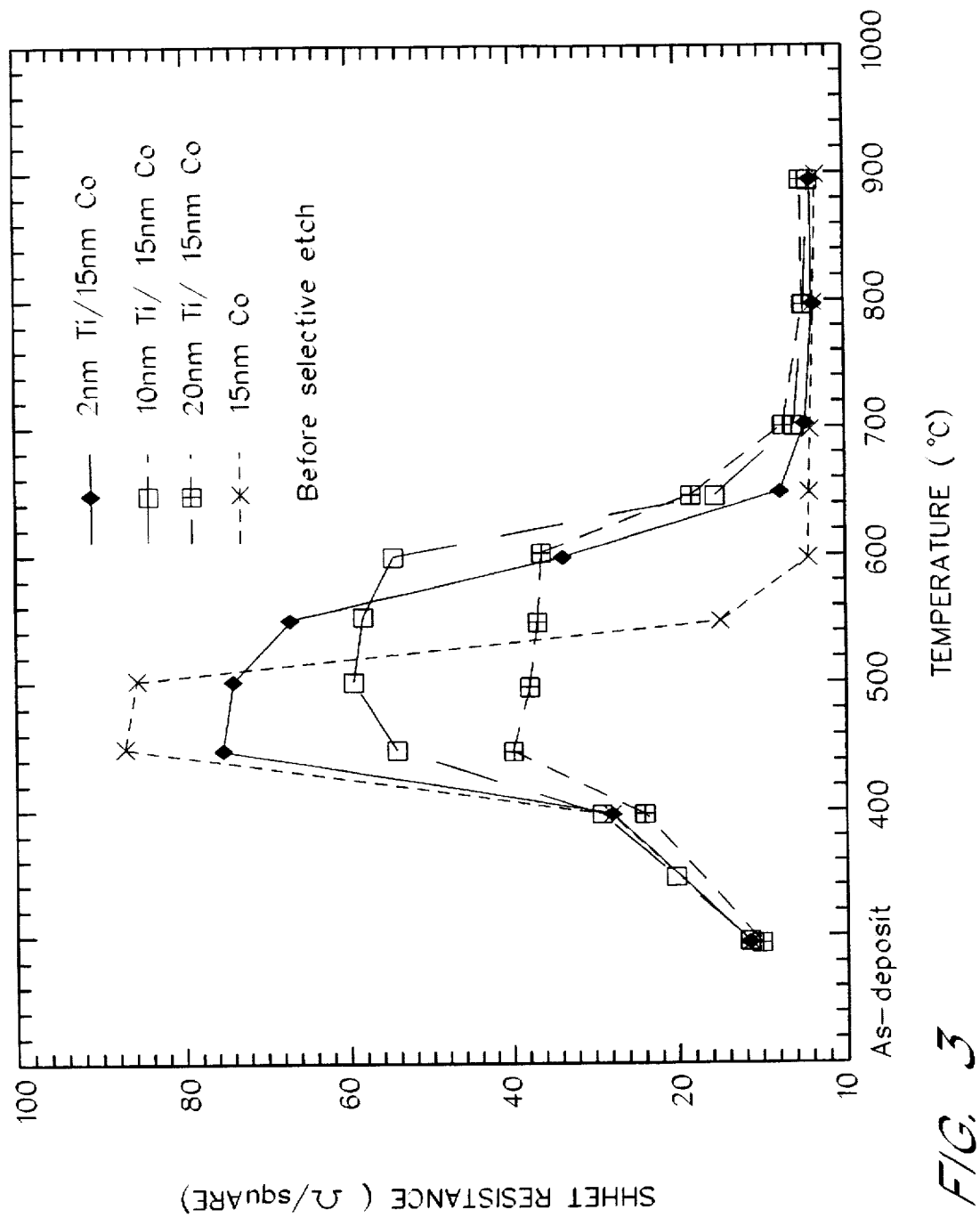

FIG. 3 shows the sheet resistance as a function of a first RTA temperature for the conventional Co process and the capping Co/Ti process according to the present invention.

Figure 4A:
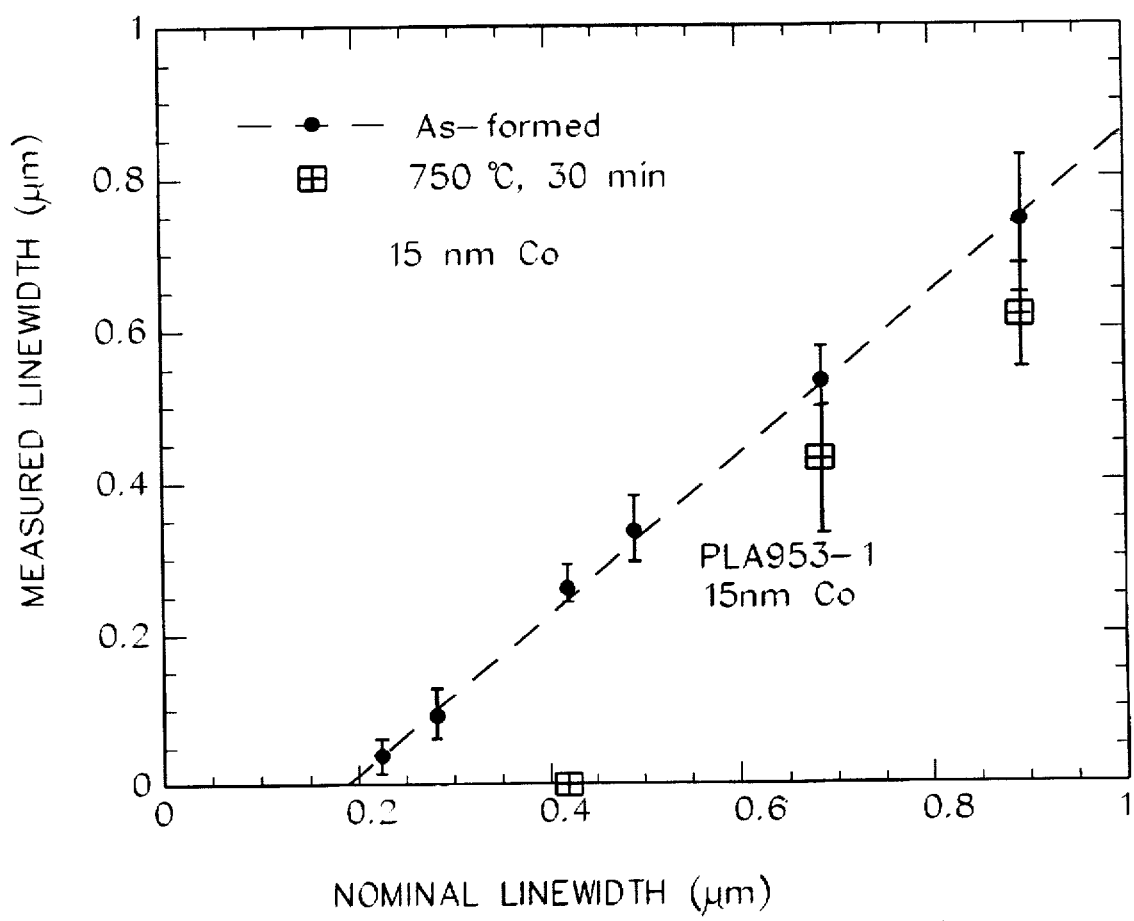
Figure 4B:
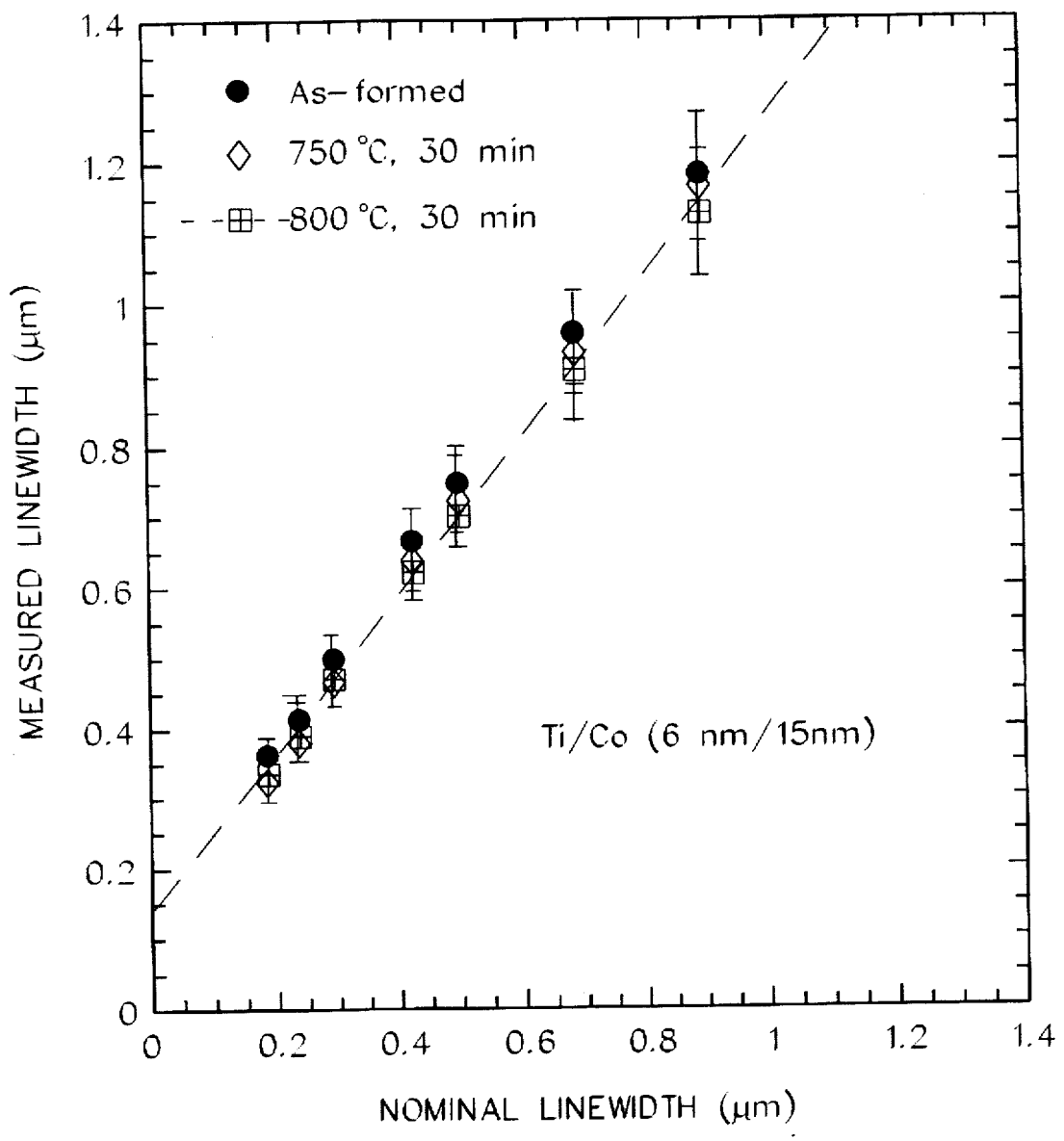
Figure 4C:
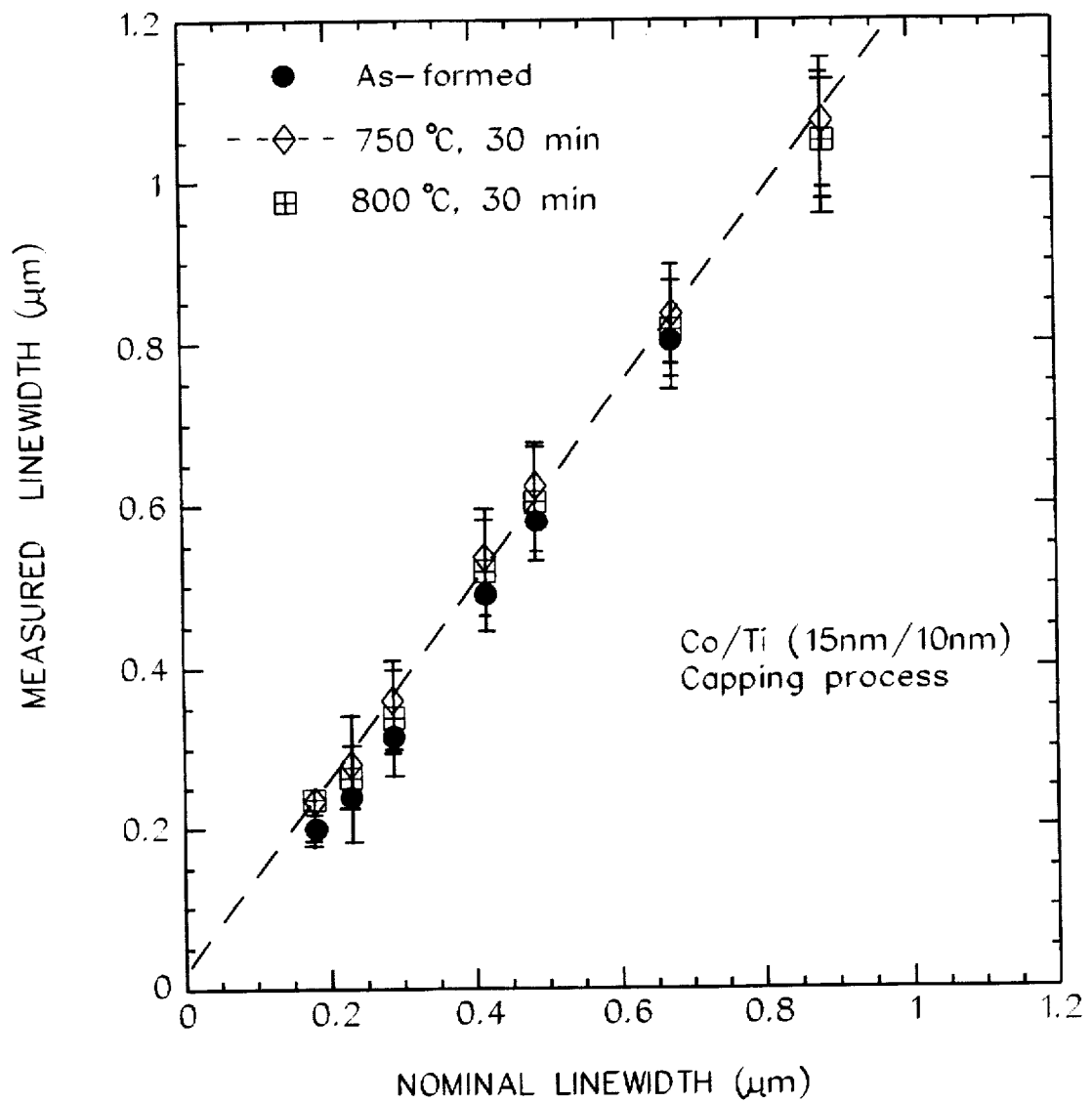

FIGS. 4a–4c represent the electrically measured linewidth as a function of an optically measured linewidth for the three processes described in branch I (FIG. 4a), branch II (FIG. 4b), branch III (FIG. 4c) of FIG. 1.

Figure 5A:
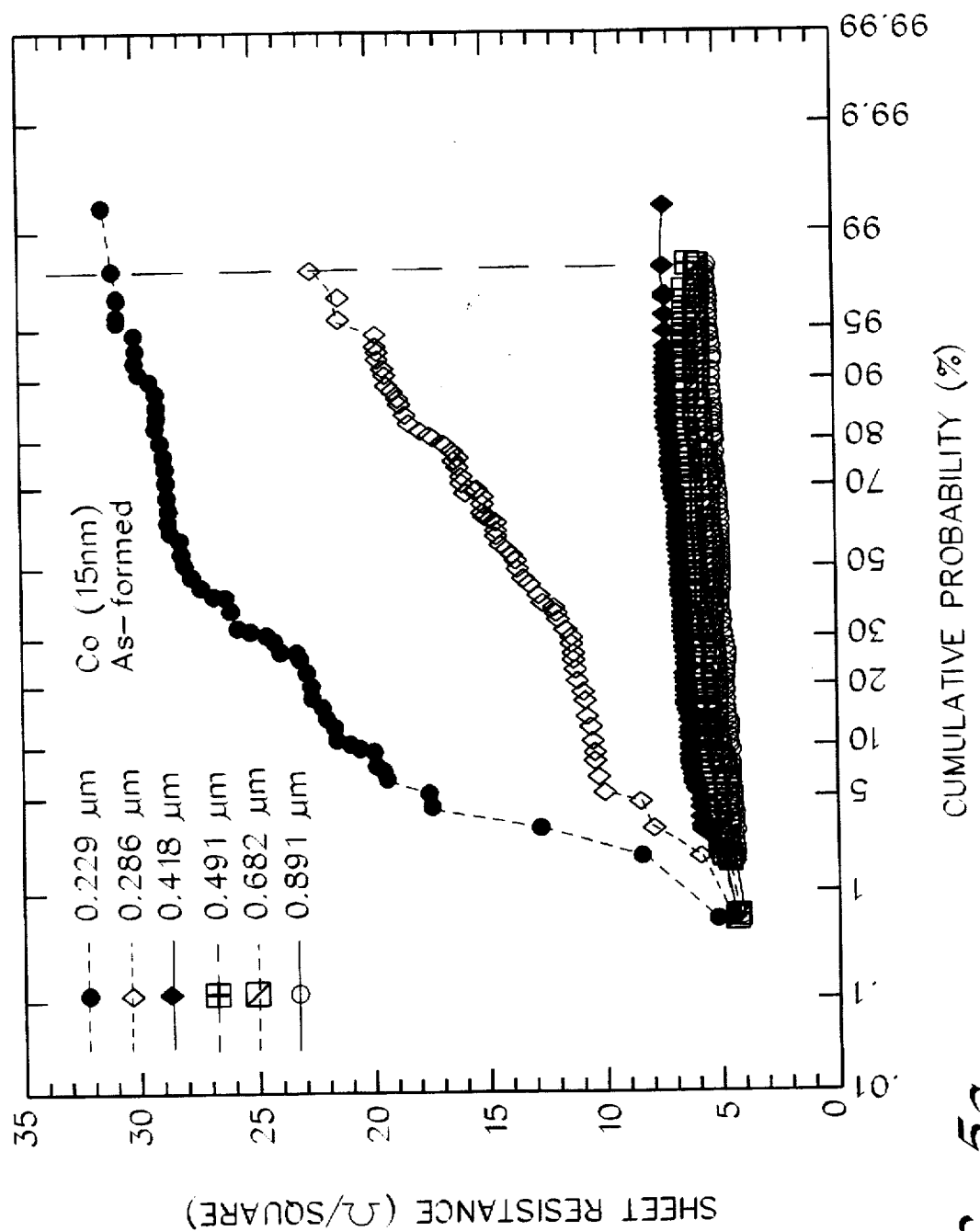
Figure 5B:
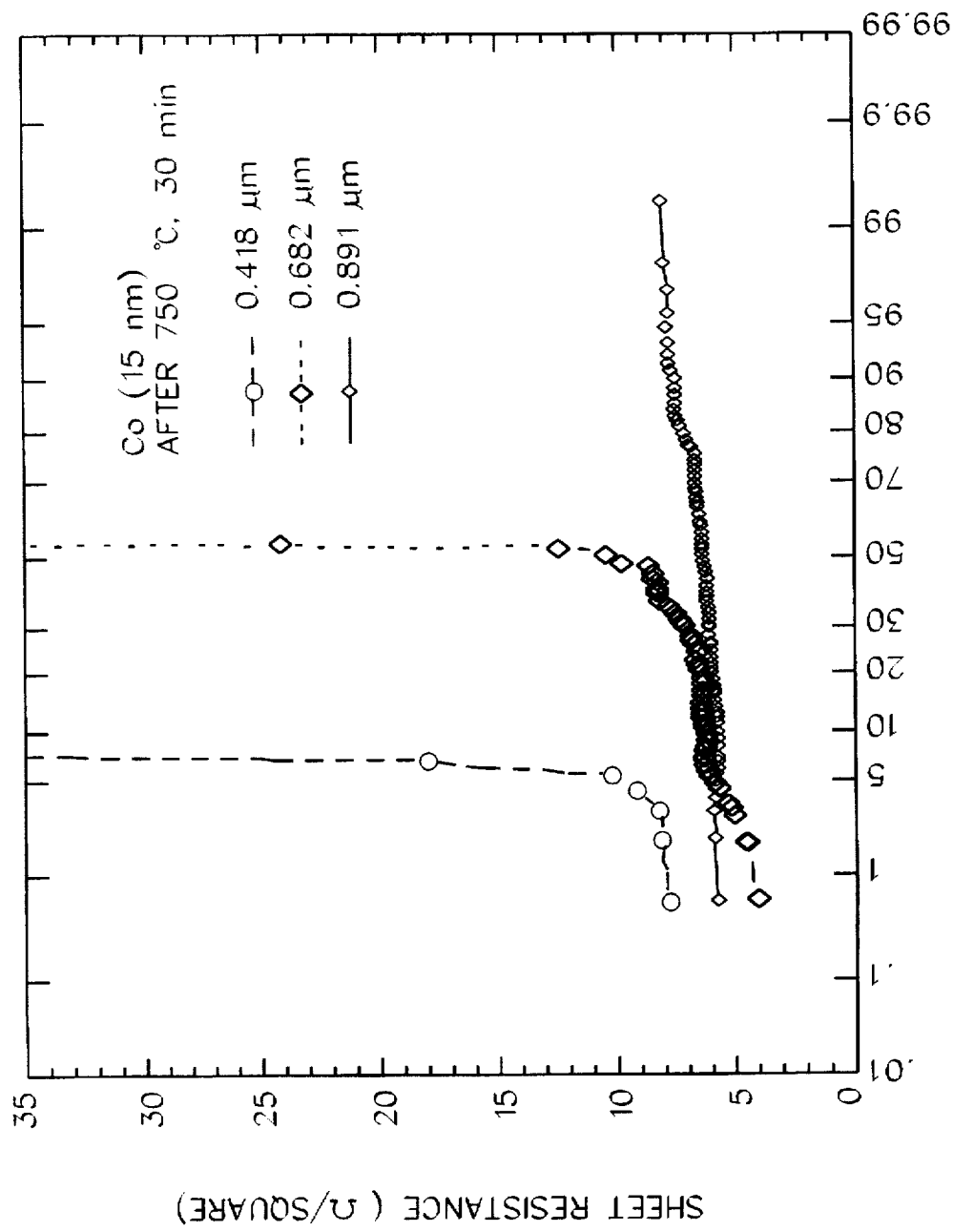
Figure 6A:
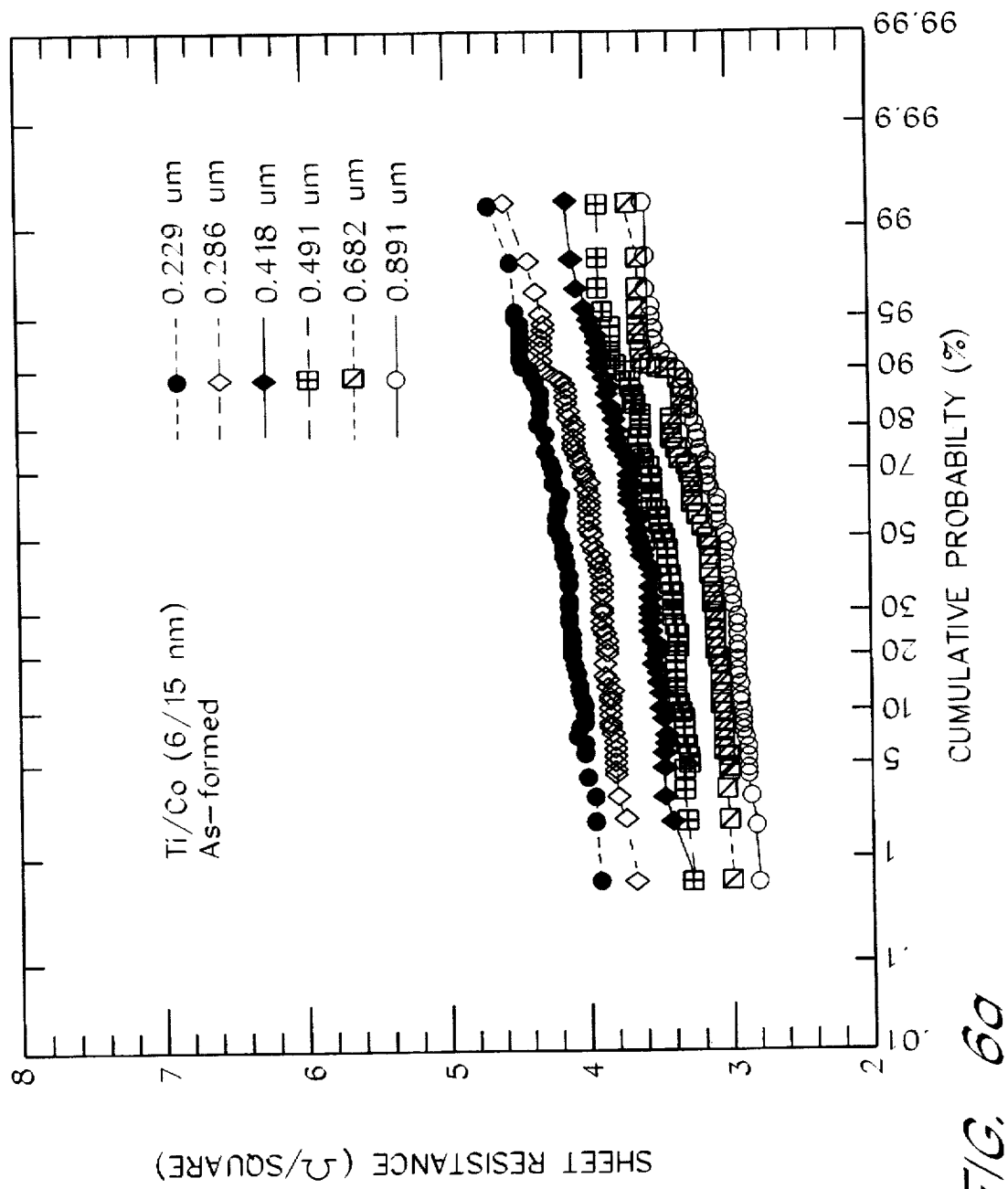
Figure 6B:
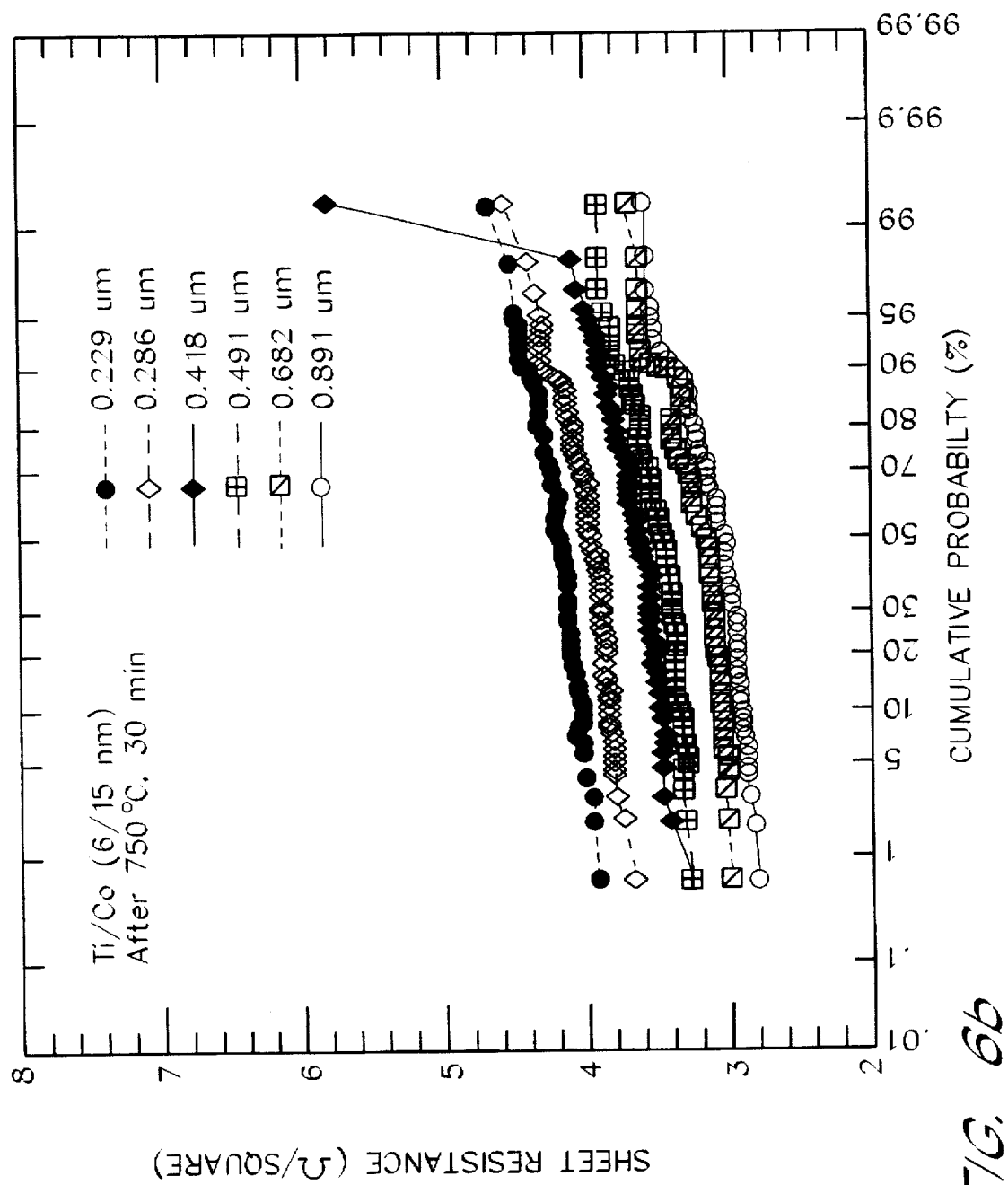
Figure 7A:
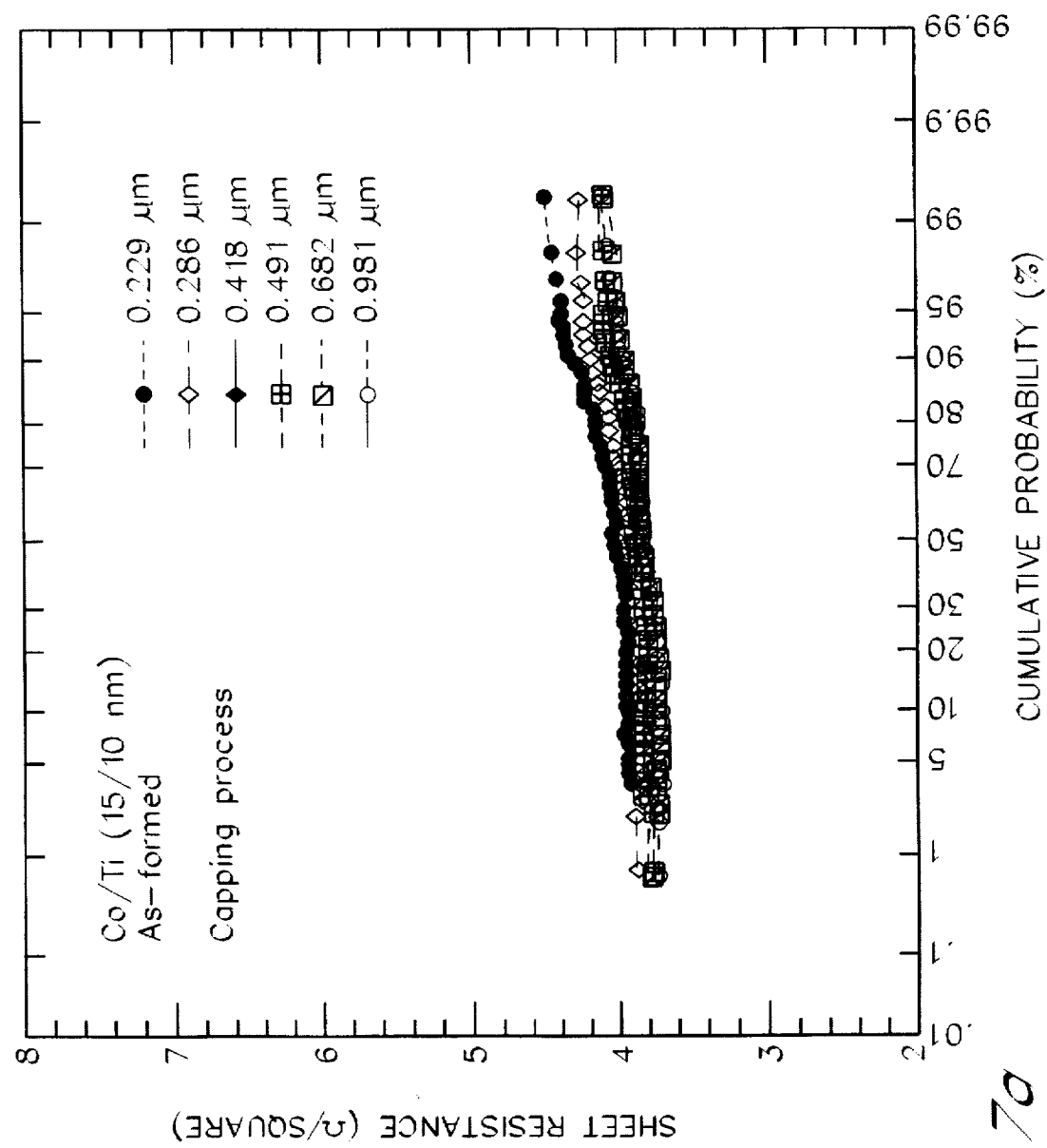
Figure 7B:
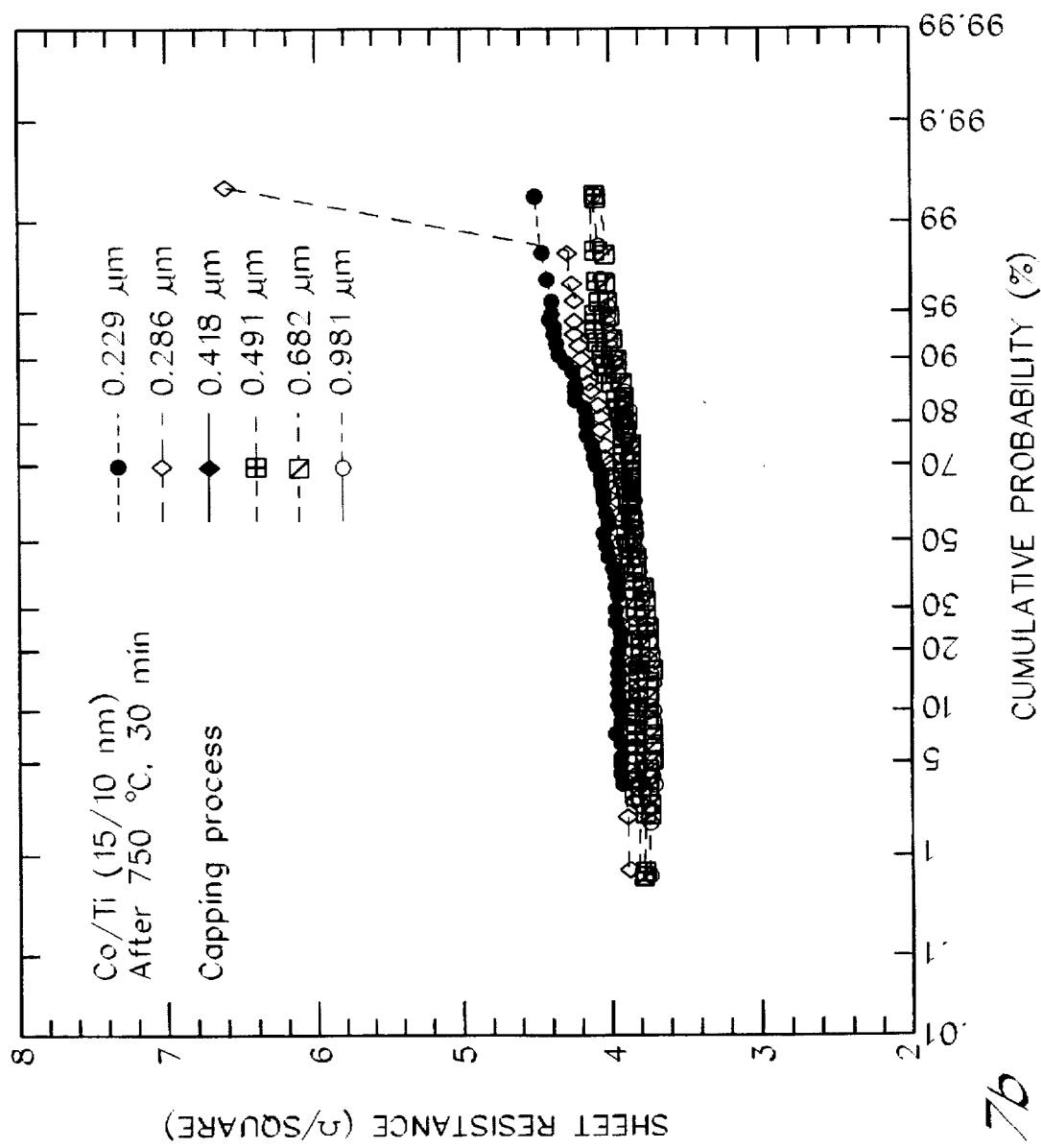

FIGS. 5, 6, and 7 represent the cumulative probability of the sheet resistance of different gate widths for the three processes described in branch I, branch II, and branch III of FIG. 1 in the case of As-formed film (FIGS. 5a, 6a, 7a respectively) and in the case after a heat treatment consisting of a 750° C., 30 min furnace annealing (FIGS. 5b, 6b, 7b respectively).

Figure 8:
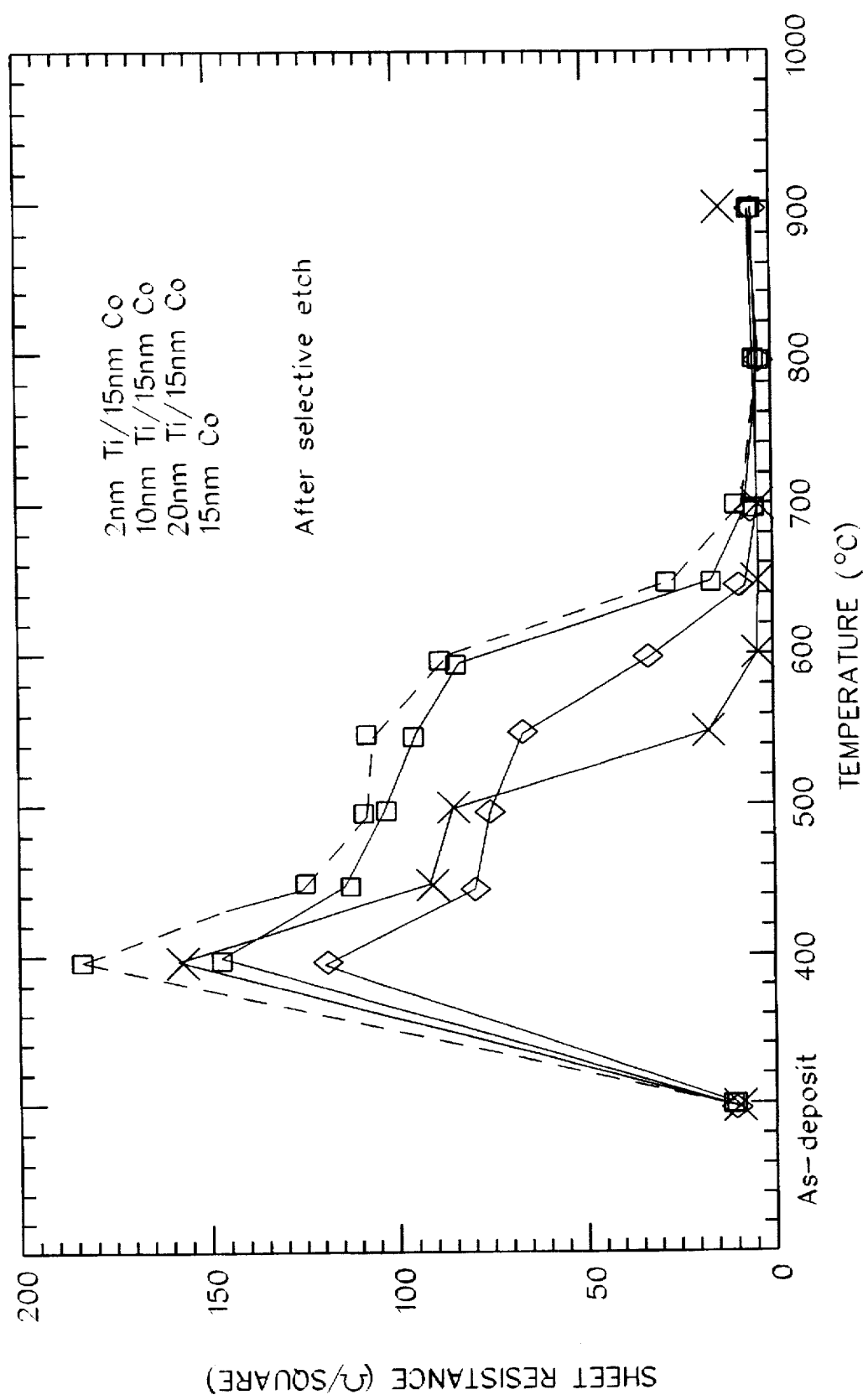

FIG. 8 shows the sheet resistance as a function of the first RTA temperature.

Figure 9:
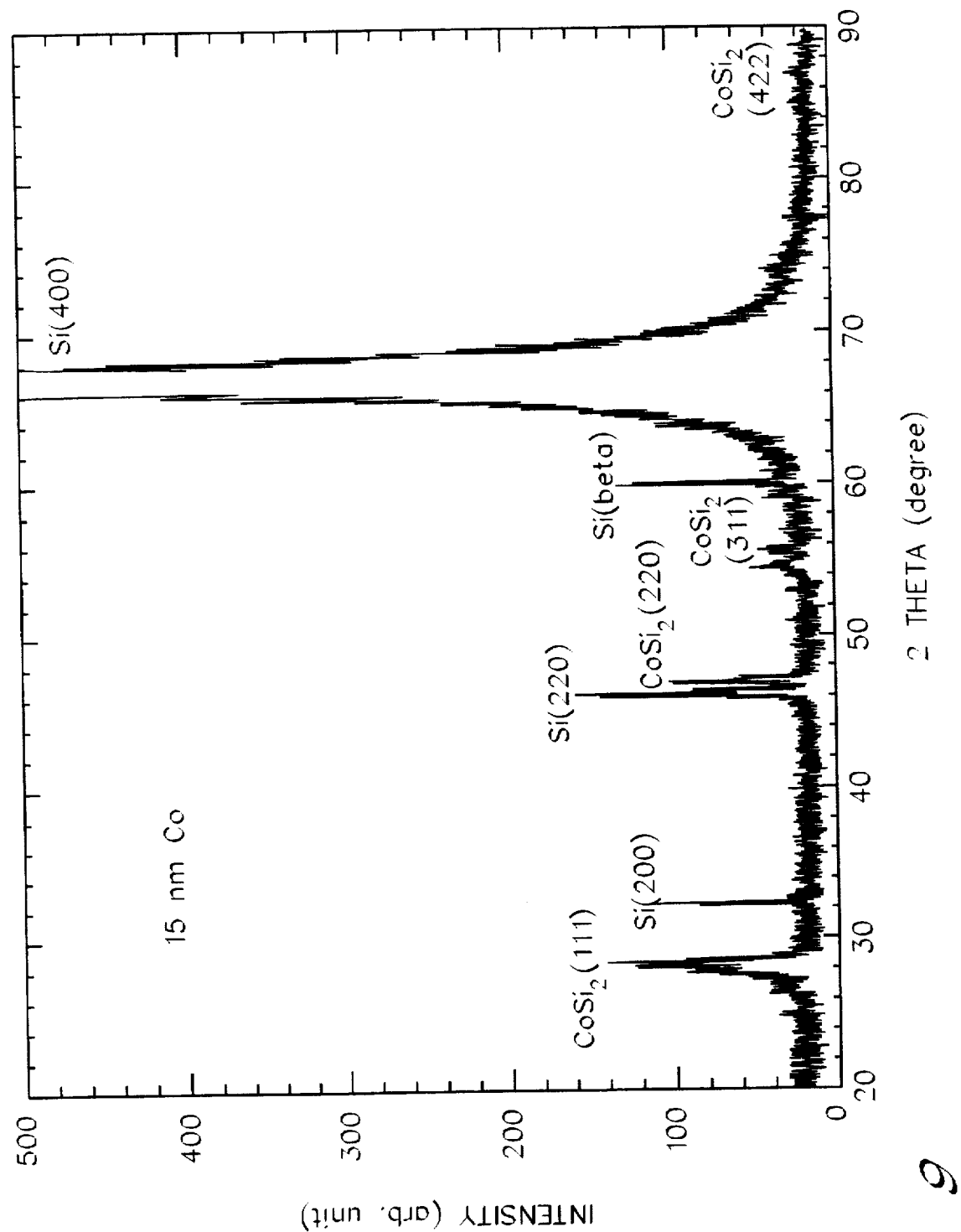
Figure 10:
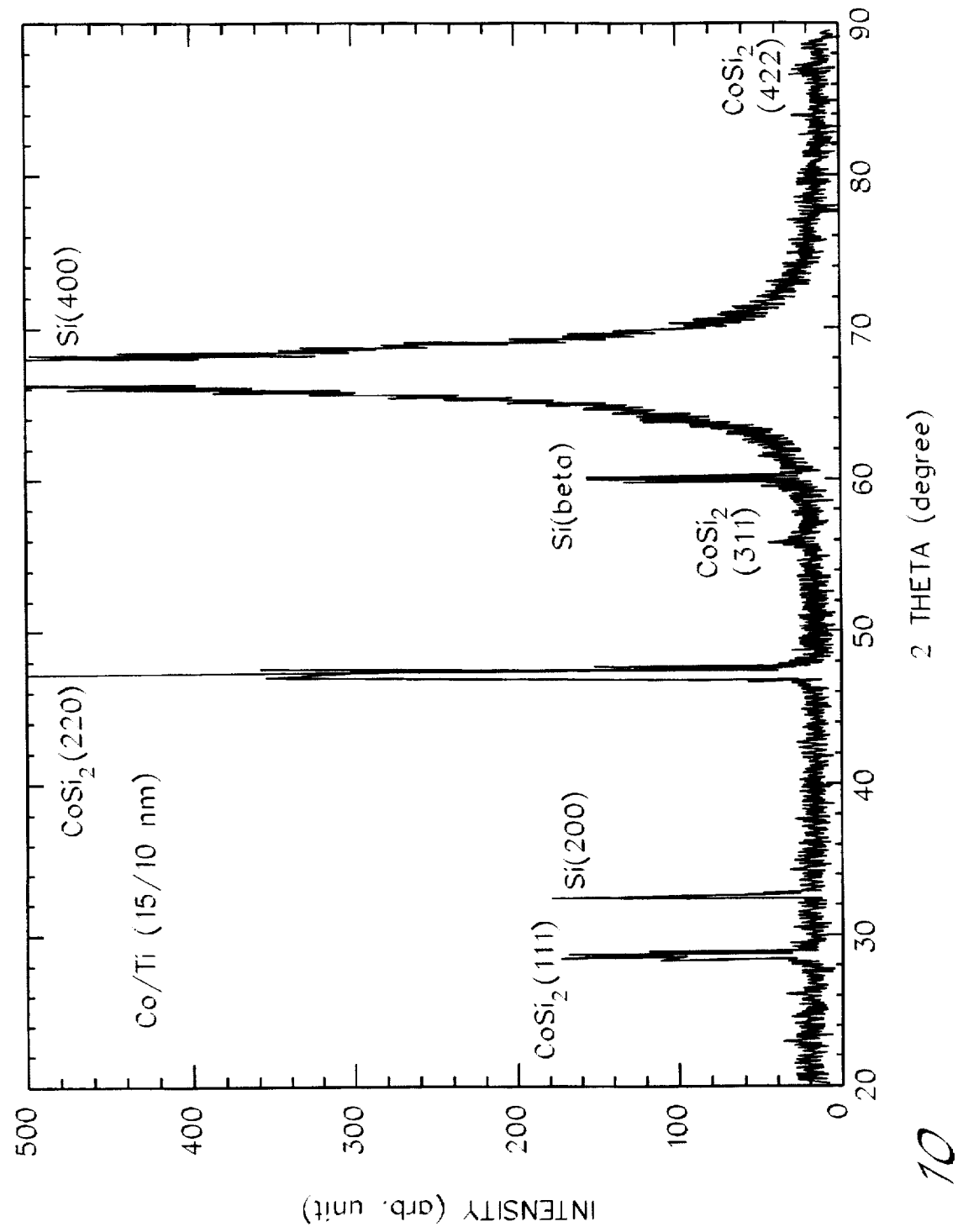

FIGS. 9 and 10 represent the X-ray diffraction spectra of $CoSi_2$ manufactured either according to the Co conventional process (FIG. 9) or according to the capping Co/Ti process according to the present invention (FIG. 10).

Figure 11A:
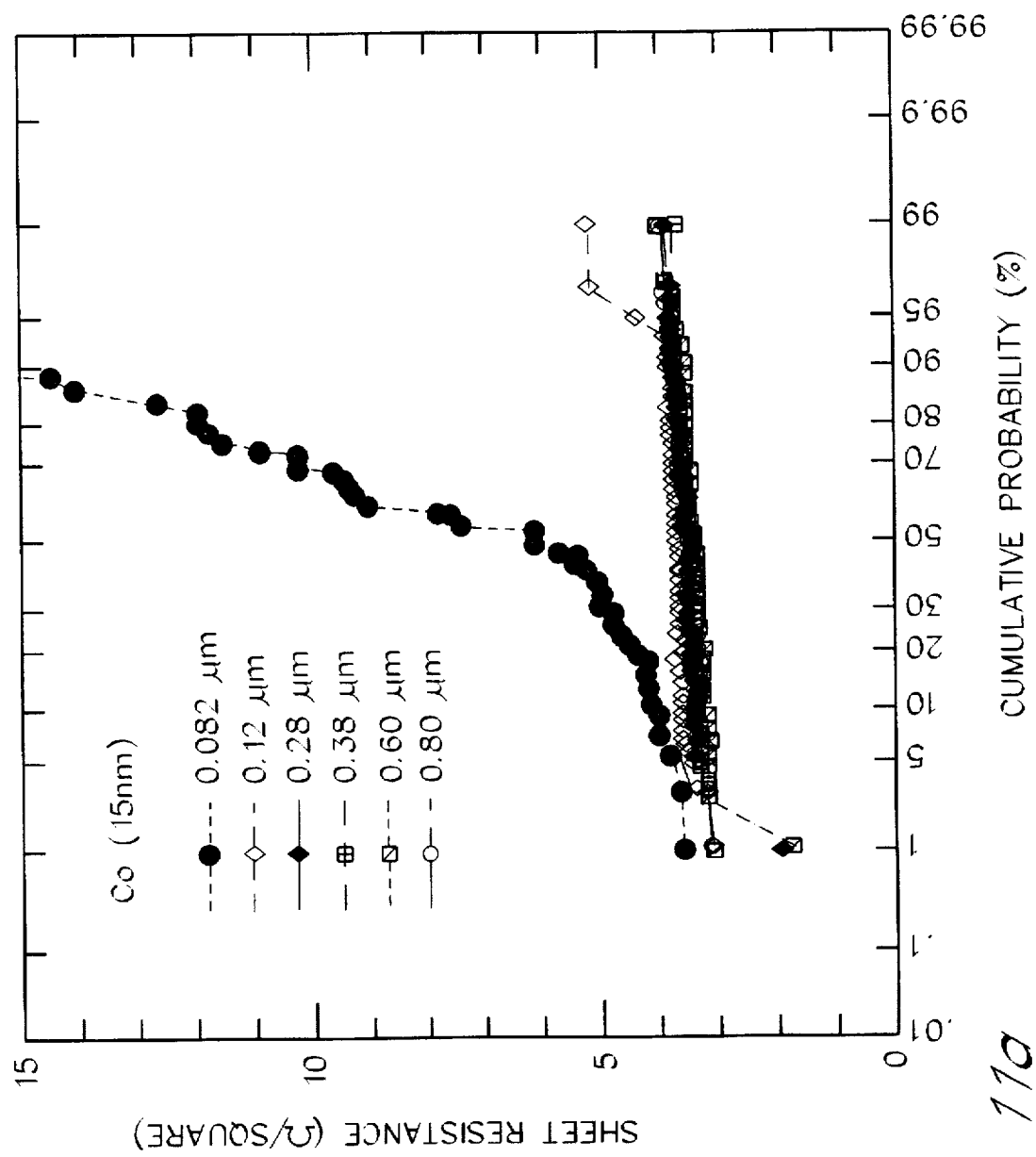
Figure 11B:
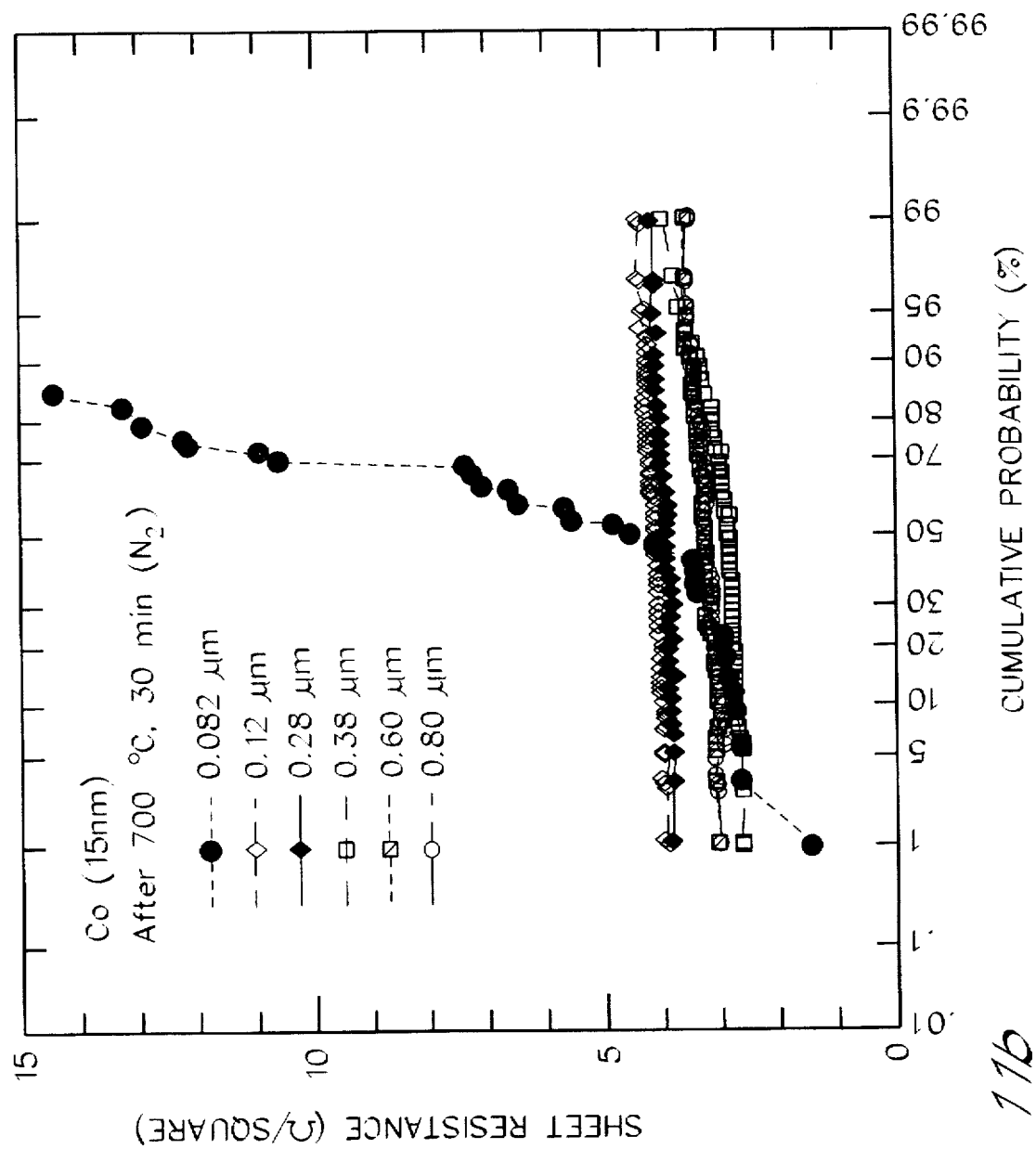

FIGS. 11a and 11b represent the cumulative probability of the sheet resistance for the capping Co/Ti process according to the present invention as formed (FIG. 11a) and a heat treatment consisting after 700° C. and 30 minutes furnace heating (FIG. 11b).

Figure 12A:
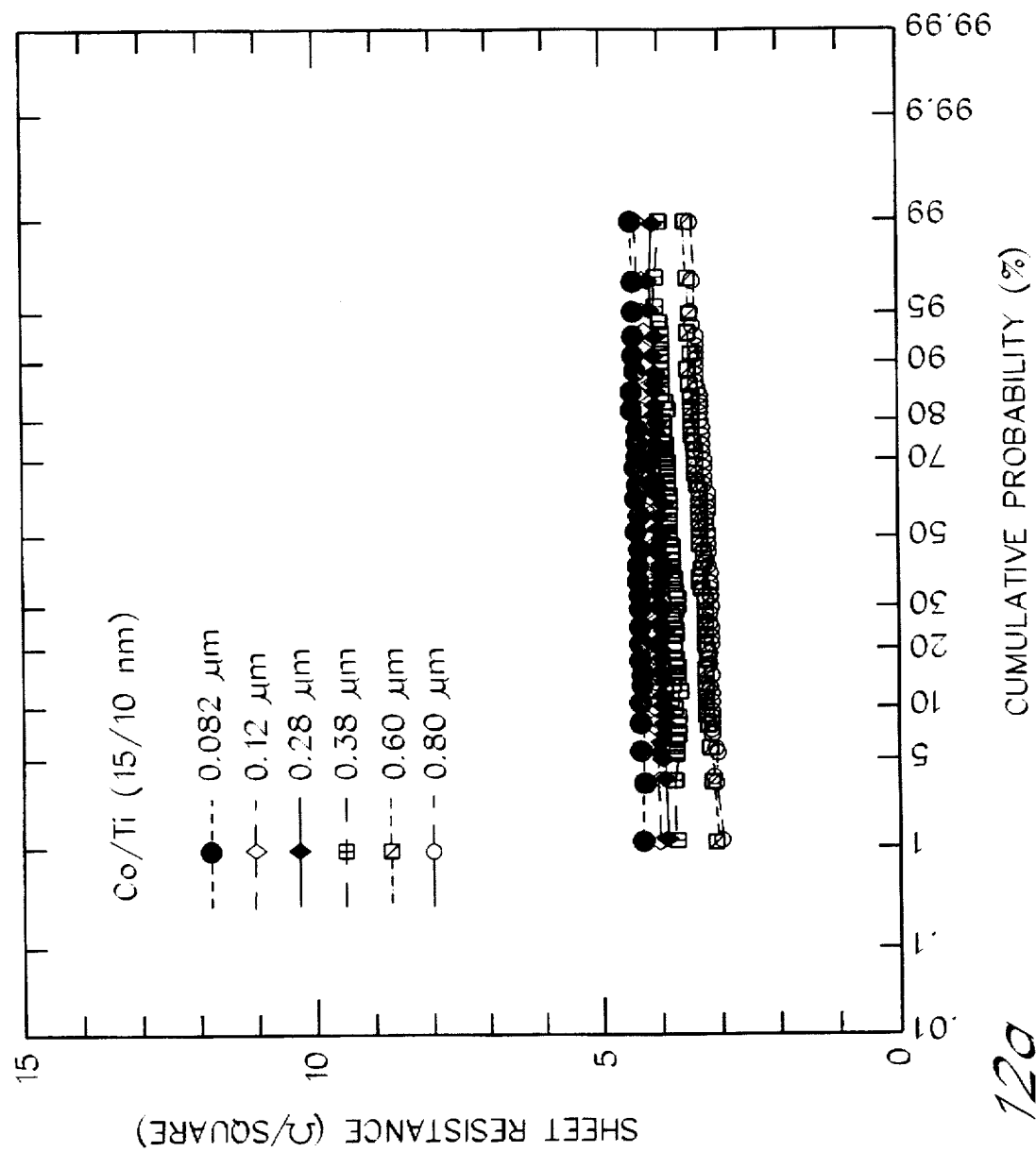
Figure 12B:
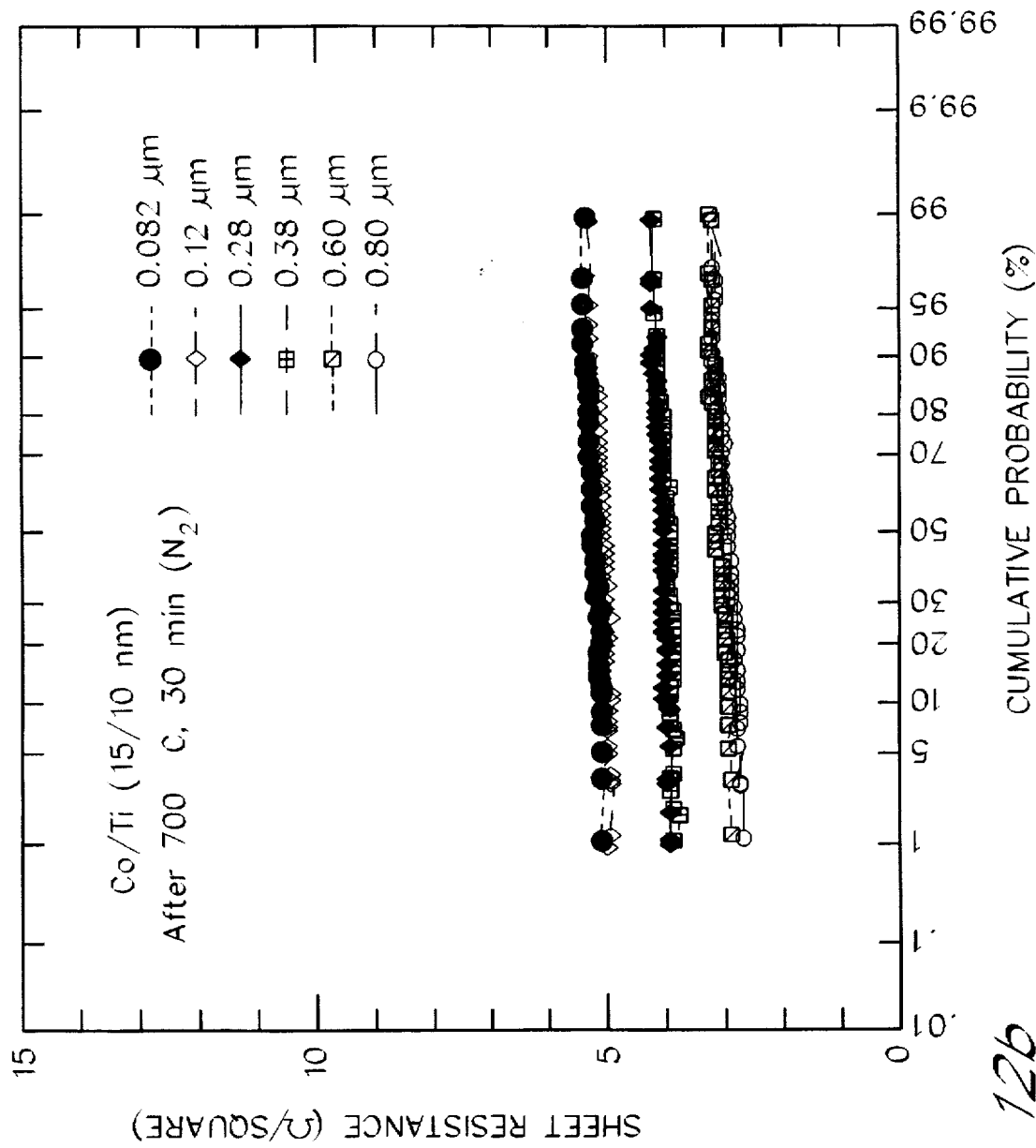

FIGS. 12a and 12b represent the cumulative probability of the sheet resistance for the conventional Ti/Co process according to the present invention, as formed (FIG. 12a) and after 700° C. and 30 minutes furnace heating (FIG. 12b).

DETAILED DESCRIPTION OF THE PREFERRED EMBODIMENT

A first embodiment of the present invention is shown on FIG. 1, wherein a comparison is made with prior art processes. The major steps of transistor gate formation for a 0.25 μm CMOS process are simulated.

The devices obtained after performing each step of the process according to the present invention are represented in FIG. 2.

Figure 2A:
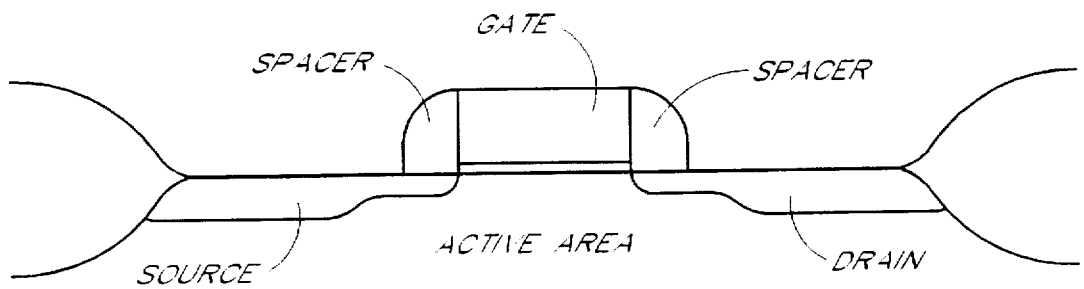

The starting wafers are (100) oriented, p-type silicon wafers having a resistivity of more or less 10 Ωcm (see FIG. 2a).

After an RCA-type cleaning in $NH_4OH/H_2O_2$, $HCl/H_2O_2$, and BHF, a 350 nm thermal oxide is grown. A 300 nm silicon polylayer is then deposited. It should be understood that the thickness of 350 nm for the oxide layer and the thickness of 300 nm for the polysilicon layer are only illustrative embodiments. Similar results, as the one disclosed in the sequel, can be obtained with thin (3–10 nm) oxide layers and with 150–250 nm polysilicon layers.

In this preferred embodiment, deep UV lithography was used to define ~0.25 μm poly lines, followed by ~150 nm tetraethyl orthosilicate (TEOS) oxide spacer formation. Other lithography techniques could be used as well. The wafers then are dipped in diluted HF to remove a native oxide layer, just prior to loading into the sputter vacuum system. Three process conditions are used:

Branch I:
 ~15 nm cobalt film sputtering which is called the conventional Co process.

Branch II:
 ~6 nm titanium film followed by a ~15 nm cobalt film sputtering which is referred to as the conventional Ti/Co process.

Figure 2B:
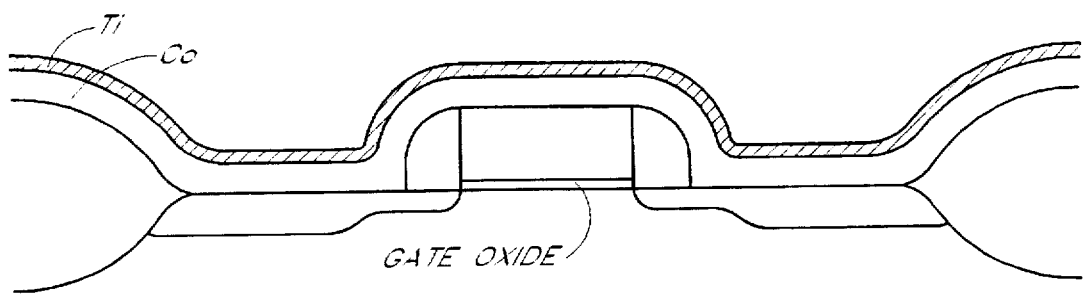

Branch III:
 ~15 nm cobalt film followed by 10 nm titanium film sputtering which is referred as the capping Co/Ti process according to the present invention. It can be executed with the cobalt layer thickness ranging between 5 and 50 nm and the titanium layer thickness ranging between 1 and 20 nm (FIG. 2b).

The Co and Ti layers are preferentially sputtered sequentially without breaking the vacuum conditions. For the conventional scheme, a standard heating using a two step RTA silicidation is employed (the first RTA at about 550° C. for about 30 s, and the second RTA at about 700° C. for about 30 s), while for the capping process a slightly modified heating process is used: the first RTA preferentially at about 550° C. for about 60 s, and the second RTA preferentially at about 700° C. for about 30 s. The first RTA step can be executed within a range of about 450° C. to about 600° C. with the heating time ranging between about 10 and about 100 seconds, the second RTA being performed within a range of about 600—about 1000° C. with the heating time ranging between 10 and 100 seconds. All the RTA's are performed in an AST SHS 2000 model.

Figure 2C:
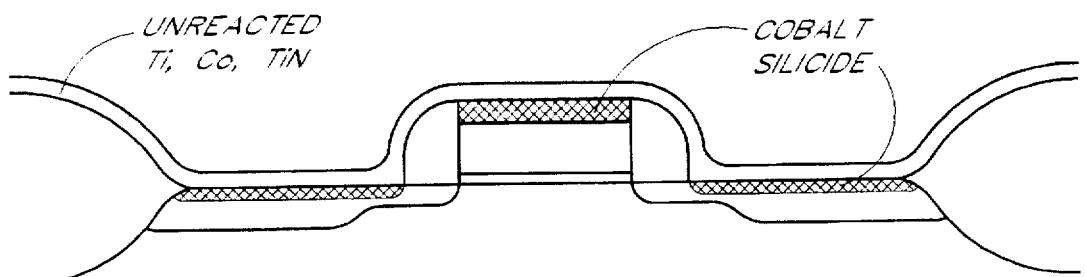

The selective etching is performed between said first and said second RTA steps. The remaining metals (Co/Ti/TiN not being transformed to silicides) after heating are selectively etched using a $H_2So_4$ solution and a $NH_4OH$ solution as etchants. The structure obtained according to the described process is self-aligned (FIG. 2c).

Figure 2D:
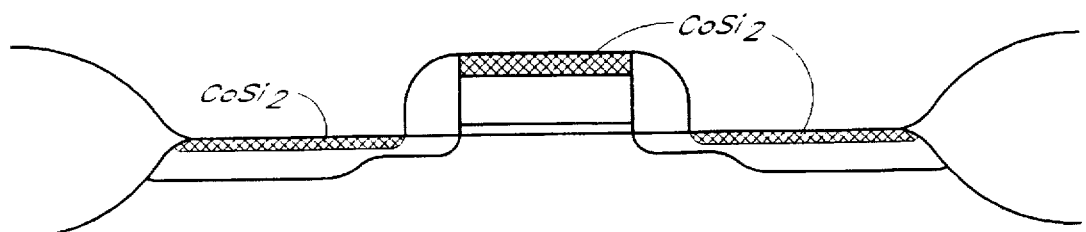

After silicide formation, 10 nm oxide is deposited to prevent silicide surface oxidation during subsequent furnace anneal. Furnace anneal at 750° C. for 30 min is chosen to simulate the CMOS backend process. The wafers are analyzed by four point probe, by scanning electron microscope (SEM) and by electrical linewidth measurements. Data are collected from approximately 80 structures across the wafer (FIG. 2d).

To investigate the effect of titanium capping, capping layers with various thicknesses were used. FIG. 3 depicts the sheet resistance as a function of first RTA temperature for the capping Co/Ti process compared to the conventional cobalt process. The sheet resistance is measured without removal of neither the unreacted Co nor the Ti (and/or TiN). The sheet resistances first go up at the same temperature (~400° C.), and then go down from ~550° C. to ~650° C. depending on the process conditions. This can be explained by the silicide phase transformation sequence: Co→Co$_2$Si→CoSi→CoSi$_2$. The data confirm that the titanium capping layer does not significantly affect the CoSi formation but retards the formation of CoSi$_2$.

FIGS. 4a, 4b, and 4c depict the electrically measured linewidth versus optically measured linewidth for the conventional cobalt process for the conventional Ti/Co process and for the capping Co/Ti process. The linewidth is obtained based on the following formula:

$$W = L(I/V) \times R_{vdp}$$

where L is the length of the bridge resistor, I is the forced current, V is the measured voltage drop, and $R_{vdp}$ is the sheet resistance measured from van der Pauw structure.

Comparing FIGS. 4b and 4c, one can find that even for the as-formed case the conventional process gives a strong apparent linewidth loss, which is believed to result from non-uniform silicide formation. The As formed lines using the capping Co/Ti process show the good characteristics. The result is even more prominent after back end processing. After 750° C. furnace anneal for 30 min, the capping process does not give a notable degradation of the sheet resistance of the lines. The conventional process, however, yields a significant increase in sheet resistance (decrease in linewidth) for the narrowest lines for the same 750° C. anneal.

To confirm the uniform CoSi$_2$ formation using the capping Co/Ti process, a cross-sectional SEM micrograph can be viewed by experiment.

FIGS. 5, 6, and 7 give the statistical data of sheet resistance for different linewidths for the conventional Co process (FIGS. 5a and 5b), for the conventional Ti/Co process (FIGS. 6a and 6b) as well as for capping Co/Ti process (FIG. 6a and 6b) respectively. Carefully examining FIGS. 5 and 6, one can find that thin CoSi$_2$ is not uniformly formed on the narrowest lines. For lines narrower than ~0.3 µm, there is a large spread in the distribution. After 750° C., 30 min furnace anneal, only the widest lines show good thermal activity. In contrast, the capping Co/Ti process (FIG. 7a) results in very tight sheet resistance distribution for all defined lines. After 750° C., 30 min furnace anneal, no significant sheet resistance changes were observed (FIG. 8b). A very tight data distribution is observed for both as-formed and heat treated films when the capping process is employed. The thermal stability improvement is due to the uniformity improvement of the silicide as formed on the narrow lines. Therefore, for thicker films and wider lines, this effect is not as pronounced.

According to a second preferred embodiment of the present invention, the formation of contacts on 0.08 µm polysilicon gates on a MOS transistor using the CoSi$_2$ salicide process according to the present invention is described in the sequel. The experiments do not show any counter evidence that the process cannot be extended to smaller gate lengths such as 0.07 µm or 0.05 µm or even smaller gate lengths. The process as described in the second embodiment of the present invention has been successfully implemented in a 0.1 =m CMOS development work on a pilot CMOS line.

The silicon substrates used in the second preferred embodiment are oriented, 5 inch device wafers. After modified clean, a thin gate oxide ~3-10 mn and a polysilicon layer of 200 nm were deposited. The test patterns are defined with direct e-beam lithography, followed by RIE etching of polysilicon. Both TEOS spacer (~100 nm) and nitride spacer (~150 nm) were investigated. S/D formation was done by As (NMOS) and BF$_2$ (PMOS) implantation respectively. Two process conditions were used: (1) ~15 nm Co films, which is the conventional Co process; (2) ~15 nm Co followed by 10 nm Ti films, which is referred to the capping Co/Ti process.

A two-step RTA silicidation process was employed. Furnace heating at 700° C. for 30 min was chosen to evaluate the thermal stability of the films. The remaining metal (Co, Ti, TiN) after heating is selectively etched using H$_2$SO$_4$ and NH$_4$OH solutions as etchants. Thus, the structure formed by this process is self-aligned. Electrical measurements were performed with an average of 49 points across the wafers. The wafers were also analyzed by plan-view and cross-section SEM after full electrical characterization.

FIG. 8 shows the sheet resistance as a function of the first RTA temperature (after selective etch) when different titanium capping layers are used compared with conventional Co process. It is clear that the titanium film retards the formation of CoSi$_2$.

FIGS. 9 and 10 depict the XRD data for Co and Co/Ti samples. The data confirms that CoSi$_2$ phase formed by Co/Ti process is identical to that formed by the conventional process, however, with a strong (220) phase.

Experiments provide the top view and cross-section SEM pictures for TEOS and nitride spacers respectively using Co/Ti process. It is clear that CoSi$_2$ is well formed on sub-0.1 µm poly lines. However, in the case of nitride spacer, there is a slight overgrowth on the top of spacer but no bridging was observed, which is also confirmed by the electrical evaluation. The conventional process, as shown by experiment (nitride spacer), also presents a good silicide film. Nevertheless, a careful comparing cross-section SEMs, we found that the CoSi$_2$/poly interface formed by Co/Ti process is much smoother than that formed by the conventional process. Furthermore, we found that conventional process is very sensitive to pre-sputtering surface condition and annealing conditions.

FIGS. 11 and 12 give the statistical data of sheet resistance for both Co and Co/Ti processes with different linewidths. Important observations can be obtained. First, a very tight data distribution is observed for all measured lines when Co/Ti process is employed (FIG. 12a). Second, it is difficult to form thin CoSi$_2$ on sub-0.1 µm poly-Si runner using the conventional process (FIG. 11a). Third, no significant sheet resistance change were observed after moderate temperature furnace anneal.

Thus, the new CoSi$_2$ salicide technology with thin Ti capping layer improves the formation and thermal stability of 0.25 µm and sub-0.1 µm CoSi$_2$/Polysilicon stacks. The capping Co/Ti process is advantageously used to produce ~0.08 µm lines.

Furthermore, the capping Co/Ti process has a wide process window to obtain uniform silicide films more reproducibly than conventional process.

While particular embodiments of the invention have been described in detail, it will be apparent to those skilled in the art that these embodiments are exemplary rather than limiting, and the true scope of the invention is that defined in the following claims.

What is claimed is:

1. A method for forming self-aligned polycrystalline cobalt disilicide on a metal oxide semiconductor transistor in a silicon substrate, said transistor having an actual gate length of about 0.18 μm or smaller and having a source region, a drain region, and a gate region, comprising the steps of:

defining an active area within said silicon substrate;

growing an oxide on said substrate;

depositing a polysilicon layer on said oxide;

defining said gate region said source region, and said draining region of said transistor within said active area;

depositing a cobalt layer on said substrate;

thereafter depositing a refractory metal layer on said cobalt layer;

thereafter heating said silicon substrate whereby forming a polycrystalline cobalt disilicide layer on said gate region, said source region, and said drain region of said MOS transistor, said heating step comprising the substeps of a first and a second heating step, said second heating step being performed at a higher temperature than said first heating step; and selectively etching, using a $H_2SO_4$ solution and a $NH_4OH$ solution as etchants, in between said first and said second heating step the remaining nonsilicide cobalt and said refractory metal from said substrate except from said gate region, said source region, and said drain region.

2. The method as recited in claim 1, wherein said deposition steps are performed by sputter deposition in a vacuum system without breaking the vacuum conditions between said subsequent deposition steps.

3. The method as recited in claim 2, wherein said refractory metal is titanium.

4. The method as recited in claim 3, wherein said cobalt layer has a thickness in the range of 5–50 nm, and said titanium layer has a thickness in the range of 1–20 nm.

5. The method as recited in claim 4, wherein said cobalt layer has a thickness of about 15 μm and said titanium layer has a thickness of about 10 nm.

6. The method as recited in claim 1, wherein said first heating step is performed in the range of 450° C.–600° C. for a period of time between 10–100 seconds and said second heating step is performed at a temperature up to about 1000° C. for a period of time between 10–100 seconds.

7. The method as recited in claim 6, wherein said first heating step is performed at about 550° C. for about 60 seconds and said second heating step is performed at about 700° C. for about 30 seconds.

8. The method as recited in claim 1, wherein said gate has an actual length of about 0.12 μm or smaller.

9. The method as recited in claim 1, wherein said gate has an actual length of about 0.08 μm or smaller.

10. The method as recited in claim 1, wherein said gate has an actual length of about 0.07 μm or smaller.

11. The method as recited in claim 1, wherein the method consists essentially of the steps enumerated.

* * * * *